(12) United States Patent
Kasunich

(10) Patent No.: US 6,351,115 B1
(45) Date of Patent: Feb. 26, 2002

(54) LOW PROFILE LAMINATED SHUNT

(75) Inventor: John M. Kasunich, Mayfield Heights, OH (US)

(73) Assignee: Reliance Electric Technologies, LLC, Mayfield Heights, OH (US)

( * ) Notice: Subject to any disclaimer, the term of this patent is extended or adjusted under 35 U.S.C. 154(b) by 0 days.

(21) Appl. No.: 09/408,008

(22) Filed: Sep. 29, 1999

(51) Int. Cl.[7] .............................................. G01R 19/00
(52) U.S. Cl. ..................................................... 324/126
(58) Field of Search ............................... 324/126, 127, 324/117 R; 336/165, 160, 208, 198, 217, 234; 318/490

(56) References Cited

U.S. PATENT DOCUMENTS 3,693,127 A * 9/1972 Smith .......................... 336/160
3,896,407 A * 7/1975 Long ........................... 336/160
4,081,777 A * 3/1978 Cronk ......................... 336/165

* cited by examiner

Primary Examiner—Vinh P. Nguyen
(74) Attorney, Agent, or Firm—Steven J. Wietrzny; Alexander M. Gerasimow; William R. Walbrun

(57) ABSTRACT

A low profile shunt has an electrically insulated substrate with opposing electrical terminals joined to a sensing device by two electrically conductive layers. The conductive layers are laminated on each side of a shunt layer extending between the terminals. An insulating tape insulates the copper foil conductive and shunt layers from each other between the terminals. The sensing element is a measuring resistor having a resistive value many times greater than that of the shunt layer such that relatively low current measurements may by made at the sensing element.

21 Claims, 3 Drawing Sheets

LOW PROFILE LAMINATED SHUNT

BACKGROUND OF THE INVENTION

Motor controllers are used to control very high power alternating current (AC) induction motors. Typically, motor controllers for these high power motors include large transistors, such as insulated gate bipolar transistors (IGBT), capable of operating at high current levels often exceeding 1,000 amps. The transistors are used to synthesize AC waveforms to drive the motor at a desired speed, torque and power consumption. The transistors receive a low level control signal, which rapidly switches the transistors on and off to produce the desired motor current.

It is often necessary to analyze the current waveforms of the transistor. However, typical high power motor controllers have the transistors connected to large bus bars within a rigid housing. Thus, it is difficult to access the transistor terminals for testing without disassembling the motor controller. Moreover, current typically must be measured while the transistor is connected to the controller circuitry and operating. Thus, even if the controller is disassembled, the transistors must be suitably connected to the controller using large conductor extensions that are capable of carrying high current levels. Large conductor extensions would be burdensome and may affect the operation of the controller and thus the accuracy of the current measurement.

There are a number of methods and devices for measuring high current waveforms. One such known device is a current transformer. Typically, current transformers have an inductive coil that surrounds a large conductor extension attached to the transistor. The current transformer steps down the high current to a fractional current value at a smaller conductor attached to the current transformer. The current at this smaller conductor can be measured by a standard meter or oscilloscope. Current transformers can handle large current levels, however, they cannot be used to test direct current DC). Moreover, current transformers are physically large and difficult to connect to the controller. Further, typical current transformers may not be suitable for testing transistor operation because of they introduce additional inductance into the current path.

Another known device is a coaxial shunt providing a high wattage resistor divider in a metallic finned cylinder. This device has a good frequency response and is capable of handling high currents. However, like current transformers, these devices are also difficult to connect to the controller circuitry because of their physical size and significant inductance.

Still another known device for measuring high current is a Hall effect current sensor. Hall effect sensors are solid-state devices that are very sensitive to the presence of magnetic fields. As known in the art, the magnetic field detected by the sensor can be used to analyze current. These devices are not well-suited from testing high current industrial controllers because they have a limited range and bandwidth and are difficult to position in the current path.

Accordingly, it would be desirable to have a device for use in analyzing current waveforms of high power devices that can be easily connected to the devices without significant disassembly or adding significant inductance to the circuit.

SUMMARY OF THE INVENTION

The present invention provides a laminated shunt with a low profile such that it can be easily disposed within small gaps between loosened assembled components. Moreover, its laminated construction and thin, wide geometry allows it to be used with low inductance AC circuits.

Specifically, the low profile laminated shunt of the present invention has an electrically insulated substrate defining a flat, planar body having terminal and measurement ends. At the terminal end, first and second conductive terminals are fixed to opposed surfaces of the substrate and have openings adjacent to and concentric with an opening in substrate. At the measurement end, two leads attach a sensing element to the substrate. First and second lead layers connect each lead of the sensing element to one of the first and second terminals. A shunt layer disposed between and substantially in the plane of the first and second lead layers connects the first and second terminals together. The shunt layer has a finite electrical resistance lower than that of the sensing element.

Insulating layers are disposed on each side of the shunt layer. The insulating layers of the shunt can include an adhesive at one or both surfaces for joining the insulating layers to the substrate. Moreover, the terminals, lead layers and shunt layer can be a metallic foil having an adhesive backing. In this case, the adhesive of the insulating, lead and shunt layers retain the layers in close proximity to each other and to the substrate, giving the shunt a laminated construction.

The present invention provides a low profile shunt that can be used to analyze electrical devices, such as motor controllers, without significant, if any, disassembly. The wide construction and low profile allow the shunt to be inserted between small gaps at electrical terminals of assembled components that are separated by loosening their connection or flexing one or more of the components. Moreover, the wide, low profile geometry gives the shunt desirable current handling capabilities without introducing a significant amount of inductance.

The present invention provides another object and advantage of a shunt that can be used to accurately analyze current waveforms using standard meters and oscilloscopes. Since the shunt layer has significantly less resistance than the sensing element, only a relatively small amount of current (preferably $\frac{1}{1,000}^{th}$ of the total) passes through the sensing element. Thus, even if a device operates at a high current, the shunt of the present invention reduces the current to be analyzed to a level suitable for ordinary meters.

The shunt of the present invention provides an additional object and advantage of providing a shunt that can be used to analyze current waveforms of low inductance circuits.

Still further, the shunt can be used to measure current in both AC and DC circuits.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

DETAILED DESCRIPTION OF THE PREFERRED EMBODIMENTS

Figure 1:
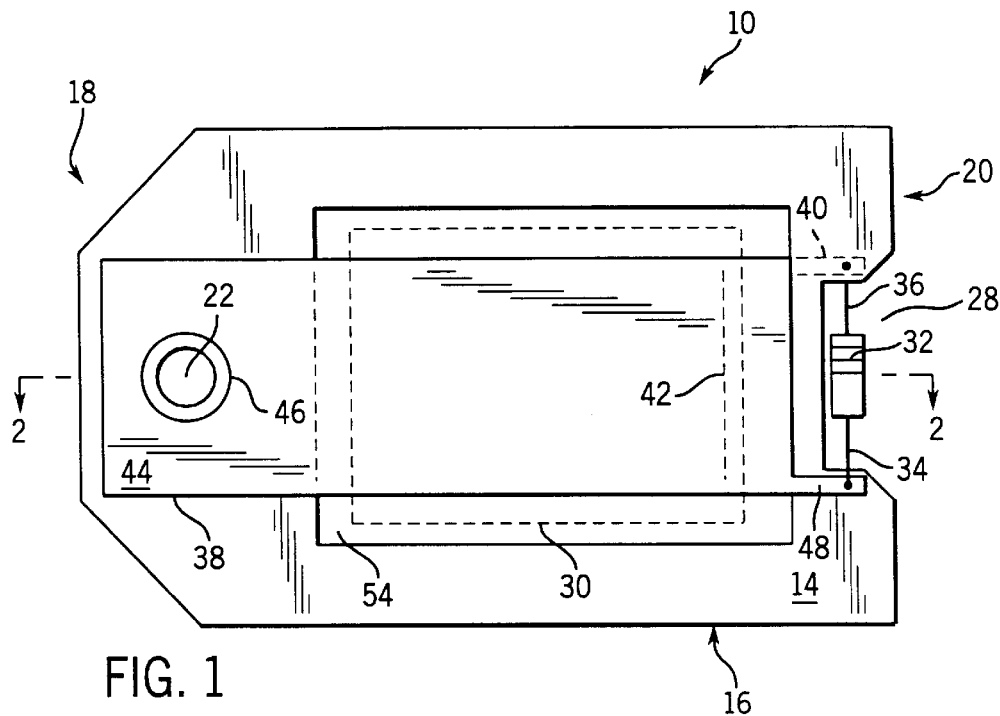
FIG. 1 is a top plan view of the laminated shunt of the present invention.
Figure 2:
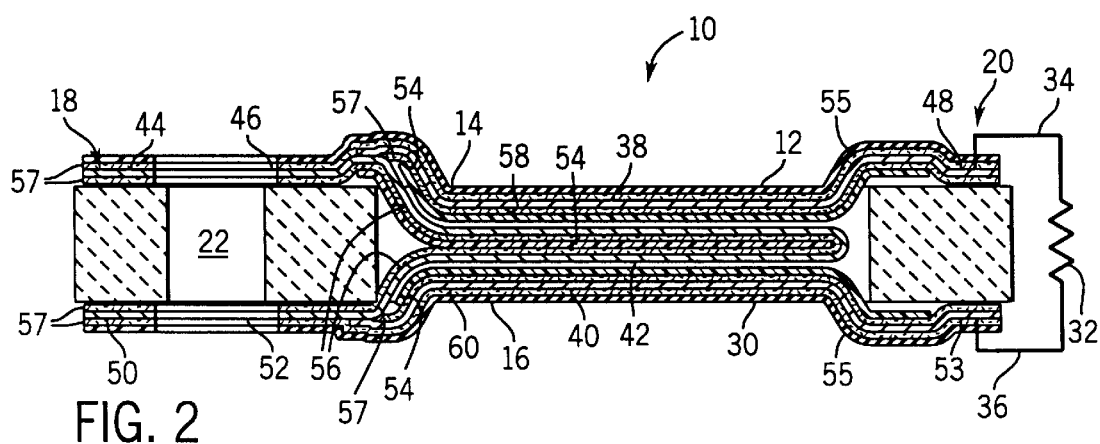
FIG. 2 is an enlarged side cross-sectional view of the shunt taken along line 2—2 of FIG. 1, the sensing element shown schematically.

Referring to FIGS. 1 and 2, an electrical shunt of the present invention is referred to generally by reference number 10. The shunt 10 has a substrate 12 made of an electrically insulating material, such as Nomex (NOMEX® is a registered trademark of E.I. du Pont de Nemours and Company of Wilmington, Del. (DuPont)). Nomex is preferred because it is largely unaffected by high temperatures, which can occur when used with high current devices for prolonged time periods. However, the substrate 12 can be made of any other suitable thin insulating material, such as card stock, without departing from the scope of the invention.

The substrate 12 is generally a thin, planar structure, approximately 20 to 50 mils thick, having a front surface 14 and a back surface 16. The front 14 and back 16 surfaces extend in a longitudinal plane from a terminal end 18 to an opposing measurement end 20. Disposed at the terminal end 18, is a circular aperture 22 of suitable size to receive a cylindrical terminal post 24 of the tested device 26 (for example the transistor shown in FIG. 4). The substrate 12 defines a notched opening 28 at the measurement end 20 and a generally rectangular void 30 proximate its longitudinal center. A sensing element 32 is disposed within the opening 28 and attached at each end to the substrate 12 by two leads 34 and 36. Preferably, the sensing element 32 is a standard 3 ohm metal film resistor.

Electrically conductive foil defines three electrical pathways: a first lead layer 38, a second lead layer 40 and a shunt layer 42, all in laminate construction with the substrate 12. Preferably, the layers 38, 40, 42 are a copper foil having an adhesive 57 backing for attachment to the substrate 12. The layers 38, 40, 42 are all several times thinner than the substrate 12, each being approximately 1 to 5 mils thick and substantially more thin than wide having roughly a 1" lateral dimension.

At the front surface 14, the first lead layer 38 defines a bus (or first) terminal 44 having a circular opening 46 concentric with the circular aperture 22 in the substrate 12. The first lead layer 38 runs from the bus terminal 44 to the measurement end 20 at which it terminates in a finger-like projection (or first leg) 48, which is in electrical contact with the lead 34 of the sensing element 32. At the opposing back surface 16 of the substrate 12, the second lead layer 40 defines a similarly shaped transistor (or second) terminal 50 having a circular opening 52 concentric with the substrate aperture 22. The second lead layer 40 runs from the transistor terminal 50 to the measurement end 20 where it terminates in a finger projection (or second leg) 53 that is electrically connected to lead 36 of the sensing element 32. Except for at their ends 44, 48 and 50, 53, respectively, the first 38 and second 40 lead layers are disposed in the central void 30 of the substrate 12 so that they do not add to the overall thickness of the shunt 10. Preferably, the ends 44, 48 and 50, 53 are adhered to the substrate 12.

As best shown in FIG. 2, the shunt layer 42 is disposed between the first 38 and second 40 lead layers. The shunt layer 42 runs roughly the distance between the terminals 44,50 and the sensing element 32 in both directions, folding back in the middle, as it electrically connects the bus terminal 44 to the transistor terminal 50. The length and width of the copper shunt layer 42 give it a discrete electrical resistance of approximately 3milli-ohms. Thus, the ratio of resistive values of the sensing element 32 and the shunt layer 42 is 1,000 to 1. As a result, current flowing through the sensing element 32 will be 1,000 times less than that passing through the shunt layer 42. This allows the shunt 10 to be used with standard meters and oscilloscopes to analyze the current waveforms of devices operating at high current levels. Preferably, the ratio of resistive values of the sensing element and the shunt layer is no less than 500 to 1.

The first 38 and second 40 lead layers are completely insulated from each other at their ends by the substrate 12 and along their run by an insulating layer 54 disposed on each side of the shunt layer 42. Another insulating layer 54 is disposed within the looped path formed by the shunt layer 42 to prevent electrical shorting across the shunt layer 42. Also, one or more additional insulating layers 55 may be disposed on the outside surface of each lead layer 38, 40 to insulate the shunt 10 from nearby circuitry or conductive components during use.

The insulating layers 54 are made of a polyamide tape having an adhesive 57, such as Kapton (KAPTON® is a registered trademark of Dupont). However, the insulating layers 54 can be made of any other suitable thin, electrically insulating material, such as cellophane tape, without departing from the scope of the invention. One of the insulating layers 54 adheres to the substrate 12 at proximate the terminal end 18 and to the inner surfaces 56 of the shunt layer 42. The other two insulating layers 54 adhere to the substrate 12 proximate the measurement end 20 and to inner surfaces 58, 60 of the respective first 38 and second 40 lead layers. The insulating layers 54 not only keep the lead layers 38 and 40 and the shunt layer 42 electrically insulated, but they also keep these layers 38, 40, 42 laminated together. Also, if the lead 38, 40 and shunt 42 layers do not have an adhesive backing, the insulating layers 54 act to secure these layers 38, 40, 42 to the substrate 12.

The thin, wide geometry and close proximity of the laminated layers 38, 40, 42 prevent the shunt 10 from introducing a significant amount of inductance into the circuit of the tested device 26. Thus, the shunt 10 can be used in low inductance AC circuits without smoothing the current waveforms and rendering the measurements inaccurate.

Figure 3:
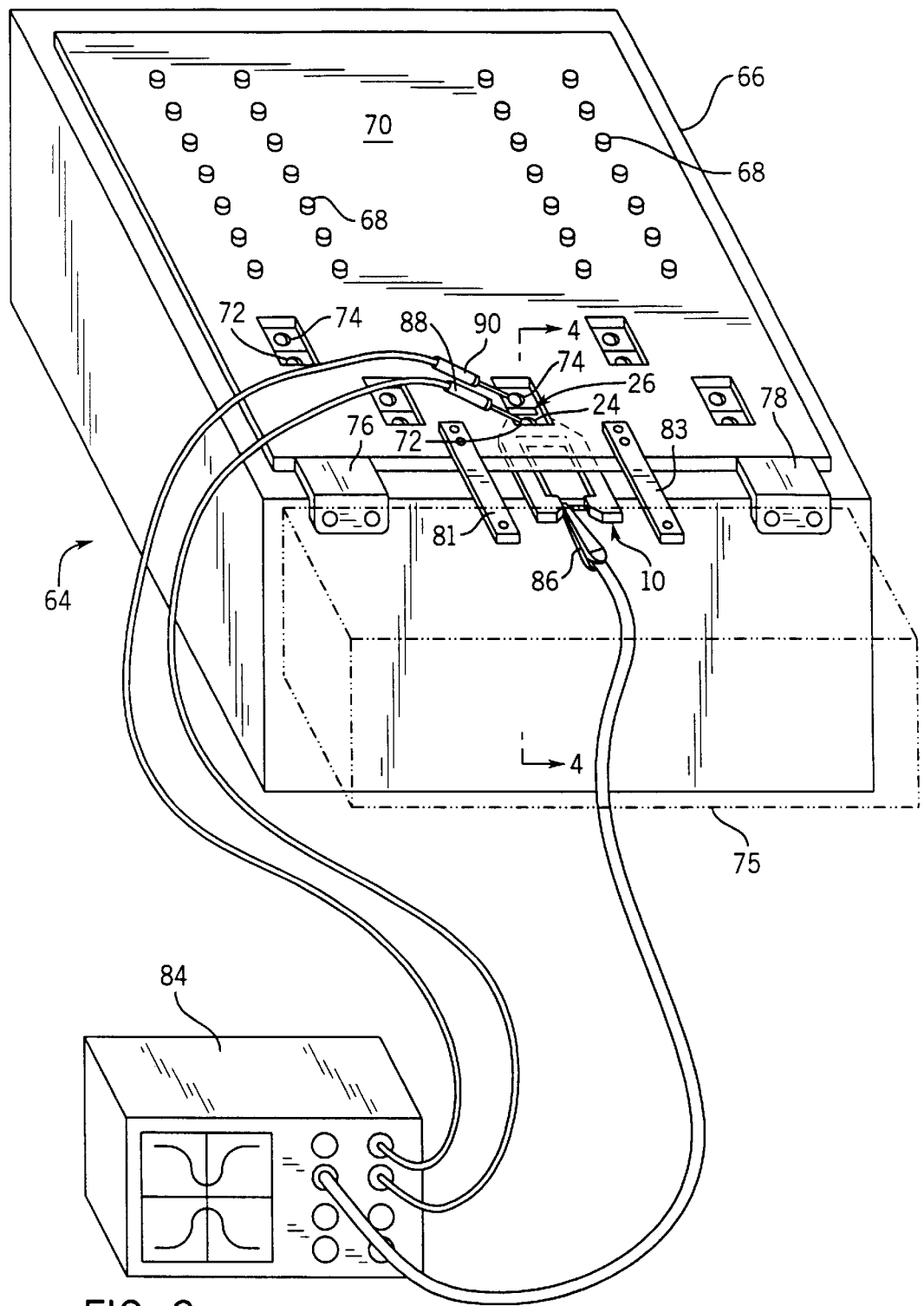
FIG. 3 is a perspective view of the laminated shunt of FIG. 1, shown in use for measuring current in a motor controller.

Referring now to FIG. 3, one example for the use of the shunt 10 of the present invention includes testing the switching of the large transistors 26 in a high current industrial motor controller 64. An exemplary motor controller 64 has a housing 66 containing a bank of capacitors 68 electrically connected to a number of transistors 26 by a rigid bus 70. The rigid bus 70 has a network of interconnected internal bus bars 72 and 74 that define two separate pathways for connecting the transistors 26 to power and other parts of the controller circuitry. The bus 70 is electrically connected to a high current power supply 75 (shown in phantom) by two external bus bars 76 and 78 suitably connected to the internal bus bars 72 and 74 of the bus 70. Power is delivered to a motor (not shown) via three output bus bars 81 and 83 (the third output bus bar is removed in FIG. 3 for clarity).

Figure 4:
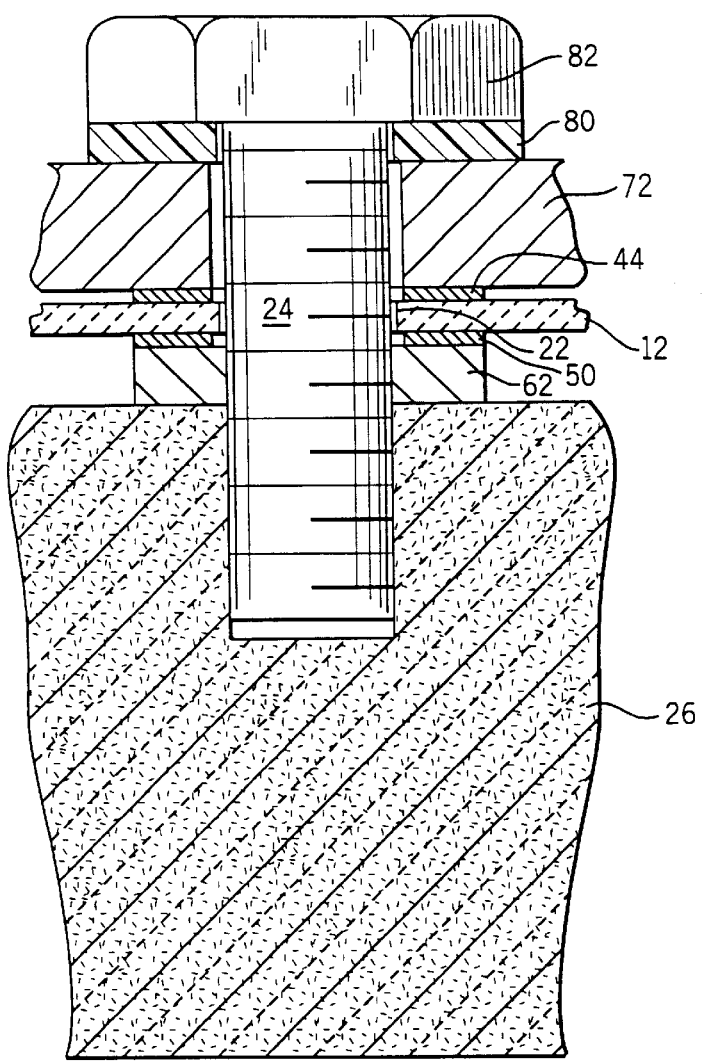
FIG. 4 is a side cross-sectional view taken along line 4—4 of FIG. 3.

Referring to FIG. 4, the shunt 10 is shown connected in line with the terminal post 24 of the transistor 26.

Specifically, the transistor terminal 50 of the shunt 10 makes surface contact with an electrically conductive terminal receptor 62 of the transistor 26. The circular aperture 22 of the shunt terminal end 18 is in concentric alignment with the terminal receptor 62. The bus terminal 44 contacts one of the internal bus bars 72 within the rigid bus 70, which has a similar aperture concentrically aligned with the terminal receptor 62. A suitable insulating washer 80 is disposed between the internal bus bar 72 and a head 82 of the terminal post 24, so that the bus bar 72 is electrically insulated from the terminal post 24.

The length and low profile of the shunt 10 makes it easy to test assembled components by loosening mounting hardware sufficiently to flex the necessary components and slip the shunt 10 in place. The only disassembly required is that needed to place the shunt 10 into the current flow path of the tested device 26, as with any other device used to measure current. However, unlike other devices, the low profile shunt 10 the present invention can be easily inserted into a circuit at the terminal connection. Specifically, the shunt 10 can be inserted beneath the rigid bus 70 by simply loosening bus mounting screws (not shown) and removing the terminal post 24 of the transistor 26. Once the shunt 10 is inserted, the terminal post 24 can be re-secured.

Referring again to FIG. 3, the shunt 10 is sufficient long so that the sensing element 32 at the measurement end 20 can be accessed when the terminal end 18 is connected to the device. When testing, the sensing element 32 can then be readily connected to a standard oscilloscope 84 via a suitable current probe 86. Alternatively, a floating voltage sensor (not shown) may be placed across the sensing element 32. Additional probes 88 and 90 can be connected to the transistor 26 or other circuitry in the motor controller 64 for making other electrical measurements.

Figure 5:
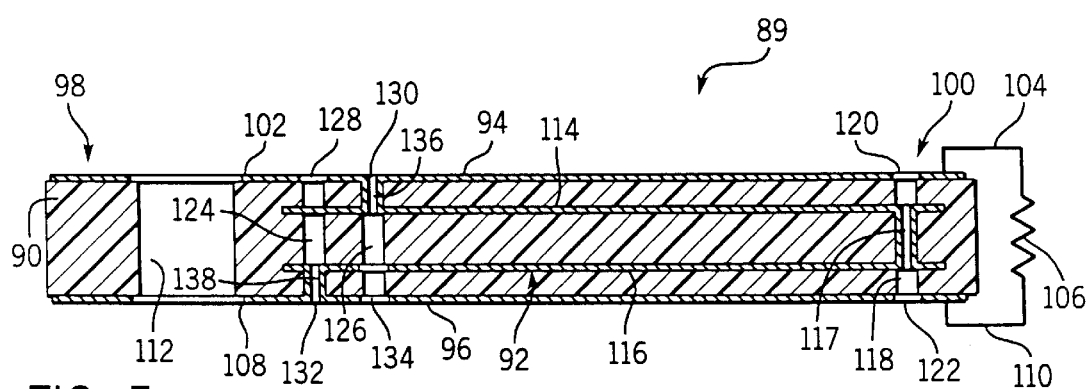
FIG. 5 is a side cross-sectional view taken along line 2—2 of FIG. 1 showing an alternate embodiment of the present invention having a circuit board substrate, the sensing element shown schematically.

In an alternative embodiment of the present invention, the shunt 89 has a rigid, solid substrate 90 comprised of circuit board material. Referring to FIG. 5, in this embodiment, the substrate 90 is a printed circuit board having four integral layers of copper cladding defining shunt 92 and first 94 second 96 lead layers. The first 94 and second 96 lead layers, respectively, are disposed at opposing surfaces of the substrate 90. At one surface, the first lead layer 94 extends from a terminal end 98 to a measurement end 100, suitably connecting a terminal opening 102 at the terminal end 98 to a first lead 104 of a sensing element 106 at the measurement end 100. Similarly, at the opposing substrate surface, the second lead layer 96 connects a terminal opening 108 at the terminal end 98 to a second lead 110 of the sensing element 106 at the measurement end 100. The terminal openings 102,108 are concentric with an aperture 112 in the substrate 90 for receiving a terminal post of the tested device.

Referring still to FIG. 5, the shunt layer 92 is comprised of two conductive layers 114 and 116 disposed within the substrate 90. The two conductive layers 114 and 116 are connected together at a connection point 117 within a plated through hole 118 proximate the measurement end 100. The through hole 118 extends through the thickness of the substrate 90 and is plated with a suitable conductive material, as is known in the art. Openings 120 and 122 in the first 94 and second 96 lead layers, respectively, are concentric with and of a greater diameter than the plated through hole 118, so that the lead layers 94, 96 do not make electrical contact with the plated through hole 118.

Proximate the terminal end 98, two additional plated through holes 124 and 126 are disposed in the substrate 90, which are concentric with lead layer openings 128, 130 and 132, 134 in the first 94 and second 96 lead layers, respectively. The opening 130 in the first lead layer 94 is sized to make electrical contact with the plated through hole 126 so that the first lead layer 94 is electrically connected to the first conductive layer 114 of the shunt at a connection point 136 in through hole 126. The opening 128 in the first lead layer 94 is larger than the through hole 124 so that they do not contact each other. Similarly, the opening 132 of the second lead layer 96 is sized to make electrical contact with the plated through hole 124 so that the second lead layer 96 is electrically connected to the second conductive layer 116 of the shunt 92 at a connection point 138 in through hole 124. The opening 132 in the second lead layer 96 is sized so that the second lead layer 96 is not connected to through hole 126.

As in the first described embodiment, the shunt layer 92 has a discrete electrical resistance, preferably 3 milli-ohms, that is roughly 1,000 times less than the sensing element 106. The sensing element 106 can be a standard metal film resistor suitably connected to the first 94 and second 96 leads at the measurement end. The shunt 89 of this embodiment is low profile so that it can be easily connected in the current path of a motor controller or other device, as is described above with regard to the first embodiment. Moreover, the construction of the shunt allows it to be used in low inductance circuits.

While the foregoing specification illustrates and describes the preferred embodiments of this invention, it is to be understood that the invention is not limited to the precise construction herein disclosed. The invention can be embodied in other specific forms without departing from the spirit or essential attributes. Accordingly, reference should be made to the following claims, rather than to the foregoing specification, as indicating the scope of the invention.

I claim:

1. A low profile laminated electrical shunt, comprising:
an electrically insulated substrate defining a flat, planar body having a terminal end and an opposite measurement end, the substrate having an opening at the terminal end adjacent to and concentric with openings in first and second terminals fixed to opposed surfaces of the substrate;
a sensing element having two leads attached to the measurement end of the substrate;
first and second lead layers connecting each of respective first and second terminals to one of the sensing element leads; and
a shunt layer electrically connected to the first and second terminals and disposed between and substantially in the plane of the first and second lead layers, the shunt layer having a finite electrical resistance lower than that of the sensing element.

2. The shunt of claim 1 further comprising insulating layers disposed on each side of the shunt layer.

3. The shunt of claim 2 further comprising insulating layers disposed on outside surfaces of the first and second lead layers.

4. The shunt of claim 2 having an adhesive at at least one surface for joining the insulating layers to the substrate.

5. The shunt of claim 2 wherein the insulating layers are polyamide tape.

6. The shunt of claim 2 wherein the terminals, lead layers and shunt layer are a metallic foil.

7. The shunt of claim 6 wherein the first and second conductive terminals are formed by the first and second lead layers, respectively.

8. The shunt of claim 6 wherein the metallic film is capable of having an adhesive backing for securing the terminals, lead layers and shunt layer to the substrate.

9. The shunt of claim 6 wherein the insulating layers retain the shunt layer in close proximity to the lead layers and secure the shunt and lead layers to the substrate.

10. The shunt of claim 6 wherein the substrate includes a void between the terminal end and the measurement end for receiving at least a portion of the shunt and the first and second lead layers.

11. The shunt of claim 6 wherein the shunt layer is folded at substantially its midpoint to define a two-ply shunt layer extending from the terminals to proximate the measurement end.

12. The shunt of claim 1 wherein the ratio of resistive values of the sensing element and the shunt layer is at least 500 to 1.

13. The shunt of claim 1 wherein the substrate is no more than 50 mils thick and the shunt and lead layers are each no more than 5 mils.

14. The shunt of claim 1 wherein the sensing device is a measuring resistor.

15. The shunt of claim 1 wherein the shunt layer comprises first and second conductive legs disposed within the substrate, the first conductive leg being electrically coupled to the first terminal, the second conductive leg being electrically coupled to the second terminal.

16. In a motor controller having a plurality of transistors connected to control circuitry by a network of bus bars comprising a rigid bus plate, the bus bars being connected to the transistors at terminals in which terminal posts are disposed, a shunt for analyzing the transistor current, comprising:

an electrically insulated substrate defining a flat, planar body sized to fit within a gap between the rigid bus and one of the plurality of transistors crated by flexing the rigid bus away from the transistors, the substrate having a measurement end and an opposite terminal end, the terminal end having an aperture sized to receive a terminal post of the transistor;

first and second conductive terminals fixed to opposed surfaces of the substrate at the terminal end and defining an aperture concentric with the substrate aperture and sized to receive the terminal post, the first and second conductive terminals having flat surfaces for making surface contact with a transistor terminal and a bus bar;

a sensing element having two leads attached to the substrate at the measurement end;

first and second lead layers connecting each of respective first and second terminals to one of the sensing element leads; and a shunt layer connecting the first and second terminals together disposed between and substantially in the plane of the first and second lead layers, the shunt layer having a finite electrical resistance lower than that of the sensing.

17. The shunt of claim 16 wherein the substrate extends in a plane so that the sensing element at the measurement end is accessible from outside the motor controller when the first and second terminals are connected to the transistor.

18. The shunt of claim 16 further comprising insulating layers on each side of the shunt layer are capable of having an adhesive backing for joining the insulating layers to the substrate.

19. The shunt of claim 18 wherein the insulating layers are polyamide tape and the terminals, lead layers and shunt layer are a metallic foil and the sensing element is a measuring resistor.

20. The shunt of claim 19 wherein the substrate defines a void between the terminal and measurement ends in which the lead and shunt layers are at least partially disposed.

21. The shunt of claim 16 wherein the shunt layer comprises first and second conductive legs disposed within the substrate, the first conductive leg being electrically coupled to the first terminal, the second conductive leg being electrically coupled to the second terminal.

* * * * *